US010132889B2

(12) United States Patent
Gui et al.

(10) Patent No.: US 10,132,889 B2
(45) Date of Patent: Nov. 20, 2018

(54) SYSTEM AND METHOD FOR REDUCING ACOUSTIC NOISE LEVEL IN MR IMAGING

(71) Applicant: General Electric Company, Schenectady, NY (US)

(72) Inventors: Dawei Gui, Sussex, WI (US); Anton M. Linz, Mukwonago, WI (US); Ajeetkumar Gaddipati, Waukesha, WI (US); Xiaoli Zhao, New Berlin, WI (US); Shaorong Chang, Waukesha, WI (US); Donglai Huo, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 1555 days.

(21) Appl. No.: 13/899,691

(22) Filed: May 22, 2013

(65) Prior Publication Data
US 2014/0347050 A1    Nov. 27, 2014

(51) Int. Cl.
G01R 33/385    (2006.01)
G01R 33/48    (2006.01)
G01R 33/561    (2006.01)

(52) U.S. Cl.
CPC ..... *G01R 33/3854* (2013.01); *G01R 33/4824* (2013.01); *G01R 33/4826* (2013.01); *G01R 33/5617* (2013.01)

(58) Field of Classification Search
USPC .......... 324/300–322; 600/407–435; 382/128–131
See application file for complete search history.

(56) References Cited

U.S. PATENT DOCUMENTS 5,402,067 A    3/1995 Pauly et al.
6,570,985 B1 *  5/2003 Romesburg ............ H04B 3/23
                                                 379/390.02

(Continued)

FOREIGN PATENT DOCUMENTS

CN    101669038 A    3/2010
WO    2009074918 A1    6/2009

OTHER PUBLICATIONS

Pierre et al., "Reduction of Acoustic Noise to Improve Patient Comfort Through Optimized Sequence Design," Proc. Intl. Soc. Mag. Reson. Med., vol. 21, 2013, p. 0253.

(Continued)

*Primary Examiner* — Melissa Koval
*Assistant Examiner* — Tiffany Fetzner (57) ABSTRACT

A system and method for reducing MRI-generated acoustic noise is disclosed. A system control of an MRI apparatus causes a plurality of gradient coils and an RF coil assembly in the MRI apparatus to generate pulse sequences that each cause an echo train to form and acquire blades of k-space data of the subject of interest from the pulse sequences, with the blades being rotated about a section of k-space compared to every other blade. The system control also causes the plurality of gradient coils to generate gradient pulses in each pulse sequence having an optimized gradient waveform that reduces an acoustic noise level generated thereby and causes the RF coil assembly to generate a 180 degree prep pulse subsequent to generation of an RF excitation pulse and prior to generation of a first RF refocusing pulse, the 180 degree prep pulse minimizing echo spacing in the echo train.

18 Claims, 8 Drawing Sheets

(56) References Cited

U.S. PATENT DOCUMENTS

| | | | | |
|---|---|---|---|---|
| 6,842,000 B2* | 1/2005 | Norris | | G01R 33/56509 |
| | | | | 324/309 |
| 8,148,979 B1* | 4/2012 | Du | | G01R 33/4816 |
| | | | | 324/307 |
| 8,228,062 B2 | 7/2012 | Sharp et al. | | |
| 8,346,340 B2* | 1/2013 | Umeda | | A61B 5/055 |
| | | | | 600/407 |
| 9,445,053 B2* | 9/2016 | Cartwright | | H04N 7/152 |
| 9,581,670 B2* | 2/2017 | Stemmer | | G01R 33/56554 |
| 9,645,211 B2* | 5/2017 | Zhou | | G01R 33/4824 |
| 2003/0225751 A1* | 12/2003 | Kim | | G06F 17/30654 |
| 2004/0071324 A1* | 4/2004 | Norris | | G01R 33/56509 |
| | | | | 382/128 |
| 2009/0124885 A1* | 5/2009 | Umeda | | A61B 5/055 |
| | | | | 600/410 |
| 2011/0241671 A1 | 10/2011 | Zhao et al. | | |
| 2012/0262172 A1 | 10/2012 | Holmes et al. | | |
| 2013/0147478 A1* | 6/2013 | Zhou | | G01R 33/4824 |
| | | | | 324/309 |
| 2014/0210471 A1* | 7/2014 | Stemmer | | G01R 33/56554 |
| | | | | 324/309 |
| 2014/0240447 A1* | 8/2014 | Cartwright | | H04M 3/569 |
| | | | | 348/14.09 |
| 2014/0347050 A1* | 11/2014 | Gui | | G01R 33/4824 |
| | | | | 324/309 |
| 2015/0087979 A1* | 3/2015 | Zhang | | A61B 8/4494 |
| | | | | 600/440 |
| 2018/0028146 A1* | 2/2018 | Zhang | | A61B 8/483 |

OTHER PUBLICATIONS

International Search Report and Written Opinion from corresponding PCT Application No. PCT/US2014/038782, dated Oct. 27, 2014; 10 pages.

Machine Translation and a First Office Action and Search issued in connection with corresponding CN Application No. 201480029556.1 dated Dec. 18, 2017.

* cited by examiner

2D FSE propeller

FIG. 3A 3D cube propeller

88 slice selective 90 degree RF pulse
90 slice selection gradient pulse
92 180 degree refocusing pulse
94 slice selection gradient pulse
98 phase encoding gradient pulse
100 frequency encoding gradient pulse or read out pulse
102 prephaser pulse
108 slew rate
110 modified 2D FSE PROPELLER pulse sequence
112 160 degree prep pulse

FIG. 6

114 3D PROPELLER pulse sequence
118 read out gradient pulse
120 phase encoding gradient pulse
122 gradient pulse
124 shoulders of read out gradient pulse
128 prephaser pulse
130 180 degree refocusing pulse

FIG. 7

116 modified 3D PROPELLER pulse sequence
118 read out gradient pulse
120 phase encoding gradient pulse
122 gradient pulse
126 RF prep pulse
130 180 degree refocusing pulse

SYSTEM AND METHOD FOR REDUCING ACOUSTIC NOISE LEVEL IN MR IMAGING

BACKGROUND OF THE INVENTION

Embodiments of the invention relate generally to magnetic resonance (MR) imaging and, more particularly, to MR pulse sequences for reducing acoustic noise levels during image acquisition.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In existing MR systems, one problem that is encountered is the loud acoustic noise generated by the system. The noise level generated by the MR system can become uncomfortably loud, both for the patient, or subject, and for the operators. The source of such acoustic noise can be many and varied, however, in general, the noise can be attributed to vibration of gradient coils included in the MR system. The noise/vibration from the gradient coils is due to Lorentz forces applied thereto that result from an interaction of a static magnetic field and electrical current, with the Lorentz forces thereby creating vibrations in the gradient coil. Structural borne and airborne noise generated in the gradient coils from the vibrations consequently radiate acoustic noise into the patient bore of the MR system.

There have been attempts at reducing the acoustic noise generated during MR imaging—with some such attempts being focused on reducing the acoustic noise via the pulse sequence employed for acquiring MR imaging data. One such technique is referred to as SWIFT (SWeep Imaging with Fourier Transformation). In SWIFT, time-domain signals are acquired in a time-shared manner during a swept radiofrequency excitation of the nuclear spins—allowing capture of signal from spins with extremely short transverse relaxation time, $T_2^*$. The field gradient used for spatial-encoding is not pulsed on and off, but rather is stepped in orientation in an incremental manner, and since the orientation of consecutive projections varies in a smooth manner (i.e., only small increments in the values of the x, y, z gradients occur from view to view), SWIFT scanning is close to inaudible and is insensitive to gradient timing errors and eddy currents. SWIFT, however, is limited regarding T1/PD contrast because of its intrinsic gradient echo property, and thus the image quality obtainable with SWIFT is limited by its intrinsic gradient echo contrasts.

Another MR imaging technique that provides reduced acoustic noise is 3D RADIAL imaging combined with a derated gradient recalled echo (GRE) sequence, which is capable of delivering T1 contrast with an acoustic level only slightly above background noise. 3D RADIAL, however, is not capable of generating clinically usable T2 and FLuid Attenuation Inversion Recovery (FLAIR) contrast. Conversely, while derated 2D fast spin echo (FSE) and 3D FSE (i.e., "3D Cube") are available techniques that provide T2 and FLAIR contrast, such techniques cannot be considered "silent" applications, as they have an acoustic level of 90 dBA with gradient slew rate derating of 10 T/m/s. While lowering of the acoustic level by further derating the gradient slew rate is possible, such additional derating is not practical, as doing so increases the echo spacing significantly because of large phase encoding gradients that cause image blurriness, SNR loss, phase ghosting artifacts, and motion induced artifacts.

It would therefore be desirable to have a system and method capable of acquiring T2 and FLAIR contrast at reduced acoustic noise levels. It would also be desirable for such acoustic noise level reduction to be achieved for different types of pulse sequences and while minimizing the impact on image quality.

BRIEF DESCRIPTION OF THE INVENTION

In accordance with an aspect of the invention, a MRI apparatus includes a plurality of gradient coils positioned about a bore of a magnet, a radio frequency (RF) coil assembly coupled to a pulse generator to emit RF pulse sequences and arranged to receive resulting MR signals from a subject of interest, and a system control coupled to the plurality of gradient coils and the RF coil assembly to control operation thereof, the system control programmed to cause the plurality of gradient coils and the RF coil assembly to generate pulse sequences that each cause an echo train to form, with each of the pulse sequences including an RF excitation pulse, RF refocusing pulses, and gradient pulses, and being programmed to acquire blades of k-space data of the subject of interest from the pulse sequences, with each blade being filled by an echo train of a respective pulse sequence, and with the blades being rotated about a section of k-space compared to every other blade. The MRI apparatus also includes a computer programmed to reconstruct an image of the subject of interest from the acquired blades of k-space data. The system control the MRI apparatus is further programmed to cause the plurality of gradient coils to generate gradient pulses in each pulse sequence having an optimized gradient waveform that reduces an acoustic noise level generated thereby; and cause the RF coil assembly to generate a 180 degree prep pulse subsequent to generation of the RF excitation pulse and prior to generation of a first RF refocusing pulse, the 180 degree prep pulse configured to minimize echo spacing in the echo train.

In accordance with another aspect of the invention, a method of MR imaging includes generating an acoustic model that provides an estimate of an acoustic noise level for any given gradient waveform that is employed in an MR pulse sequence, determining an optimized gradient waveform for gradient pulses in an MR pulse sequence that minimizes an acoustic noise level generated thereby based on the generated acoustic model, and causing an RF coil assembly in an MR imaging system to apply RF pulses during a repetition time (TR) interval of each of a plurality of MR pulse sequences to generate an echo train for each of the plurality of MR pulse sequences, wherein the RF pulses in each MR pulse sequence comprise an RF excitation pulse, a plurality of RF refocusing pulses comprising a first RF refocusing pulse and a plurality of additional RF refocusing pulses, and a 180 degree prep pulse applied between the RF excitation pulse and the first RF refocusing pulse. The method also includes causing a plurality of gradient coils in the MR imaging system to apply gradient pulses during the TR interval of each of the plurality of MR pulse sequences, the gradient pulses having the optimized gradient waveform determined from the acoustic model. The method further includes acquiring blades of k-space data of the subject of interest from the plurality of MR pulse sequences, with each blade being filled by an echo train of a respective MR pulse sequence, and with the blades being rotated about a section of k-space compared to every other blade, and reconstructing an image of the subject of interest from the acquired blades of k-space data.

In accordance with yet another aspect of the invention, a computer readable storage medium is provided having stored thereon a computer program comprising instructions which, when executed by a computer, cause the computer to determine an optimized gradient waveform for gradient pulses in an MR pulse sequence that minimizes an acoustic noise level generated thereby, wherein the optimized gradient waveform is based on a previously generated acoustic model. The instructions further cause the computer to cause an RF coil assembly and a gradient coil assembly in an MR imaging system to apply radio frequency (RF) pulses and gradient pulses during a repetition time (TR) interval of each of a plurality of MR pulse sequences, wherein the gradient pulses are applied with the determined optimized gradient waveform and wherein the RF pulses in each MR pulse sequence comprise an RF excitation pulse, a plurality of RF refocusing pulses comprising a first RF refocusing pulse and a plurality of additional RF refocusing pulses, and a 180 degree prep pulse applied between the RF excitation pulse and the first RF refocusing pulse. The instructions further cause the computer to acquire blades of k-space data of the subject of interest from the plurality of MR pulse sequences using a Periodically Rotated Overlapping Parallel Lines with Enhanced Reconstruction (PROPELLER) acquisition technique, with each blade being filled by an echo train of a respective MR pulse sequence, and with the blades being rotated about a section of k-space compared to every other blade, and to reconstruct an image of the subject of interest from the acquired blades of k-space data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
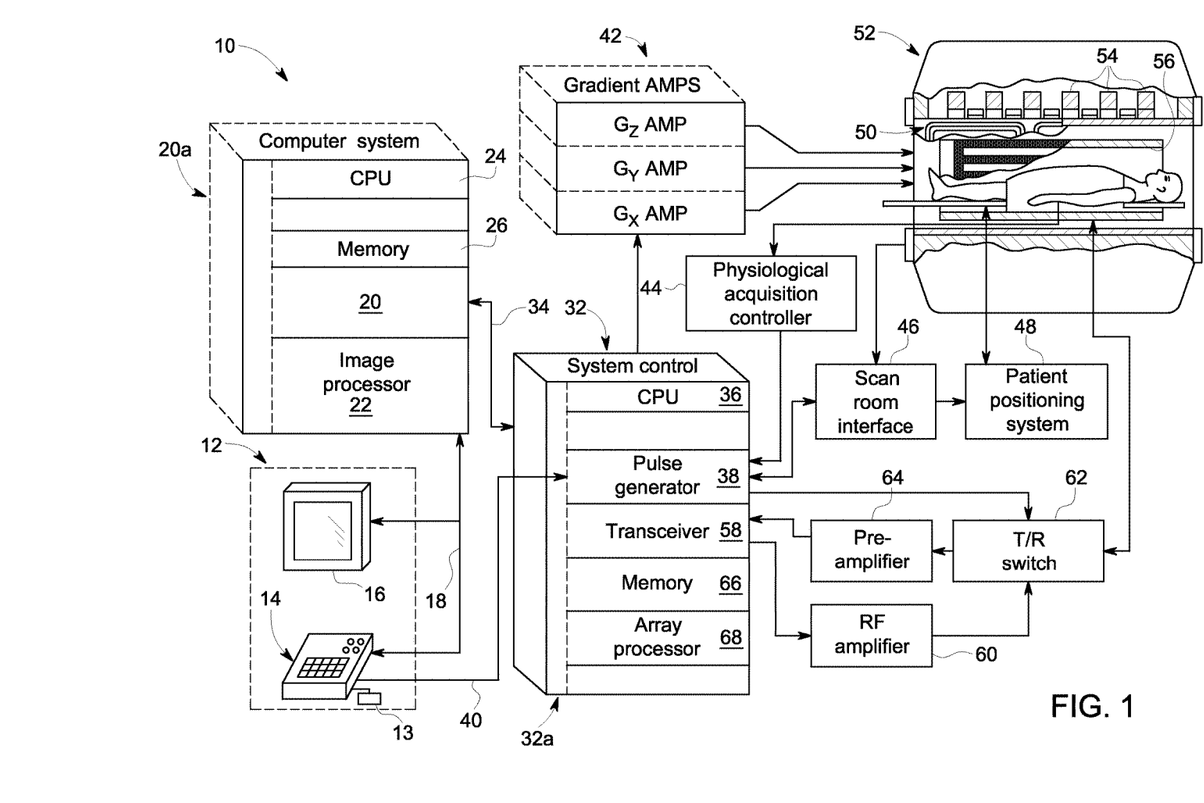
FIG. 1 is a schematic block diagram of an exemplary MR imaging system incorporating embodiments of the present invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
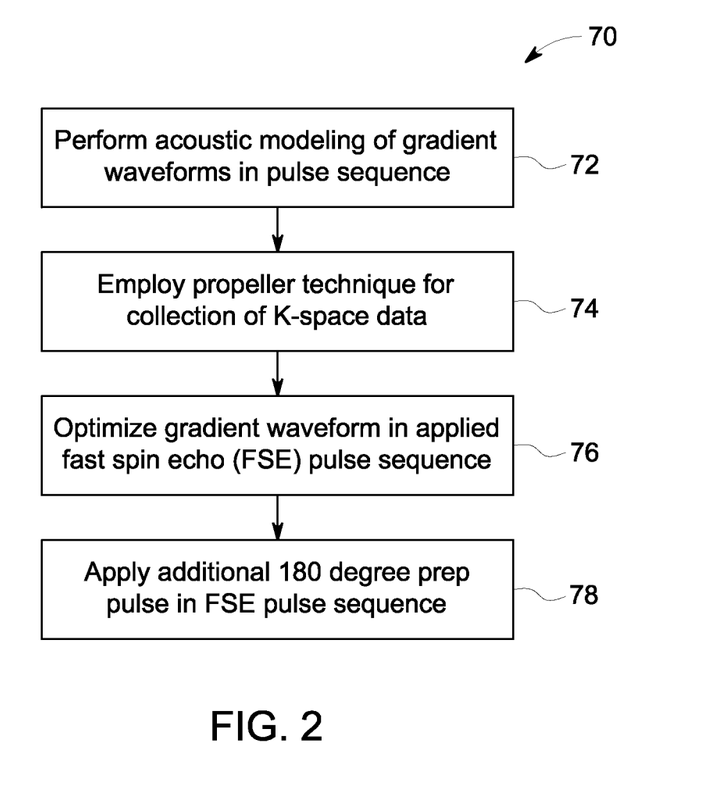
FIG. 2 is a flowchart of an MR imaging technique according to an embodiment of the invention.

FIG. 2 shows a technique 70 for MR imaging that may be implemented by MRI system 10, for example, according to an embodiment of the invention. In an embodiment of the invention, computer system 20 and system control 32 may be programmed to perform technique 70; however, it is recognized that other processing and control devices associated with MR system 10 could also implement aspects of the technique. According to embodiments of the invention, technique 70 is implementable with Fast Spin Echo (FSE) MR imaging and can be employed with various 2D and 3D FSE pulse sequences. For example, technique 70 may be employed with 2D FSE pulse sequences for T1, PD, T2, T1FLAIR, T2FLAIR and STIR contrasts and with 3D FSE pulse sequences for T2, T1, PD, and FLAIR contrasts. It is also recognized that technique 70 may also be employed in conjunction with Rotating Ultra Fast Imaging Sequence (RUFIS).

As shown in FIG. 2, technique 70 is generally split into four components or aspects. A first component of technique 70, shown as STEP 72, is directed to performing an acoustic modeling that provides acoustic estimation for any given gradient waveform that is employed in a pulse sequence. A second component of technique 70, shown as STEP 74, is directed to the acquisition of MR data, i.e., filling of k-space, with limited phase encoding, such as via the use of PROPELLER for k-space data collection so as minimize the generation of acoustic noise. A third component of technique 70, shown as STEP 76, is directed to optimizing gradient waveforms in an applied pulse sequence so as minimize the generation of acoustic noise. A fourth component of technique 70, shown as STEP 78, is directed to application of an additional 180 degree prep pulse in an applied pulse sequence, so as to minimize echo spacing and thus minimize image quality impact.

In initiating technique 70, an acoustic modeling is performed at STEP 72 that provides acoustic estimation for any given gradient waveform that is employed in an FSE pulse sequence—with such acoustic modeling being performed by computer system 20, for example. In generating such an acoustic model, a sine sweep for a transfer function is performed, with a sine gradient waveform with slowly varying frequency being played and the acoustic response being measured as a function of frequency so as to give a "transmissibility" function. The unknown phase corresponding to the known magnitude of a frequency response is estimated assuming the "minimum phase" condition and according to:

$$\arg[H(k)] \approx \text{imag}(f\!f(u_N(n)*(\text{ifft}(\log|H(k)|)))) \qquad [\text{Eqn. 1}],$$

where:

$$u_n(n)] = \begin{cases} 1_n = 0, N/2 \\ 2_n = 1, 2 \ldots (N/2)-1 \\ 0_n = (N/2+1), \ldots N-1 \end{cases}$$

The addition of the phase function turns "transmissibility" into a transfer function and results in a causal response.

The determination of the transfer function is then used to estimate the acoustic level resulting from a gradient waveform. In doing so, the derivative of a gradient waveform is taken and the frequency content is found therefrom. The frequency content is multiplied by the transfer function obtained from the sine sweep using the minimum phase method, and the equivalent average sound pressure level Leq and equivalent A-weighted average sound pressure level LAeq are calculated, with the sound pressure being described as:

$$Leq = 10 \log_{10}\left[\frac{1}{T}\int_0^T (p^2/p_0^2)dt\right], \qquad [\text{Eqn. 2}]$$

where T is the transfer function of transmissibility and p is a frequency component of the gradient waveform.

The acoustic modeling performed at STEP 72 thus generates an estimate of an acoustic noise level, i.e., average sound pressure level Leq, for any given gradient waveform that is employed in a FSE pulse sequence. It is recognized that the STEP 72 can be performed separate and apart from any MR image acquisition (a priori)—and that the acoustic models could be stored in memory, such as on computer 20, and accessed for use when a FSE pulse sequence is employed for imaging a subject.

With regard to the acquisition of MR data, at STEP 74, a fast spin echo (FSE) imaging technique (2D or 3D) is employed for data acquisition. The FSE pulse sequence uses a single excitation RF pulse and multiple phase encode steps in conjunction with multiple 180-degree refocusing pulses per repetition time (TR) interval to produce a train of echoes. In STEP 74, the FSE imaging is implemented with Periodically Rotated Overlapping Parallel Lines with Enhanced Reconstruction (PROPELLER) imaging, which is an FSE technique wherein an MR signal is encoded by collecting data during an FSE echo train of a single repetition time (TR) such that a rectangular strip, or "blade", through the center of k-space is measured—with each echo in the echo train filling a line of k-space within the blade. In subsequent FSE echo trains of separate TRs, this blade is incrementally rotated in k-space about the origin, thereby allowing adequate measurement for sufficient regions of k-space for a desired resolution.

Figure 3A:
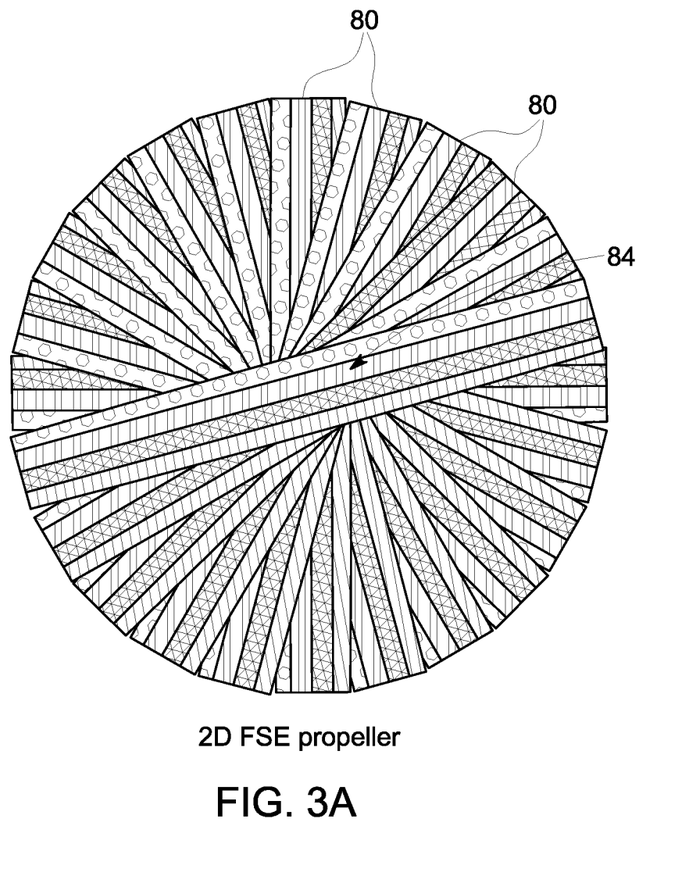
FIG. 3A is an illustration of a 2D PROPELLOR k-space data acquisition.
Figure 3B:
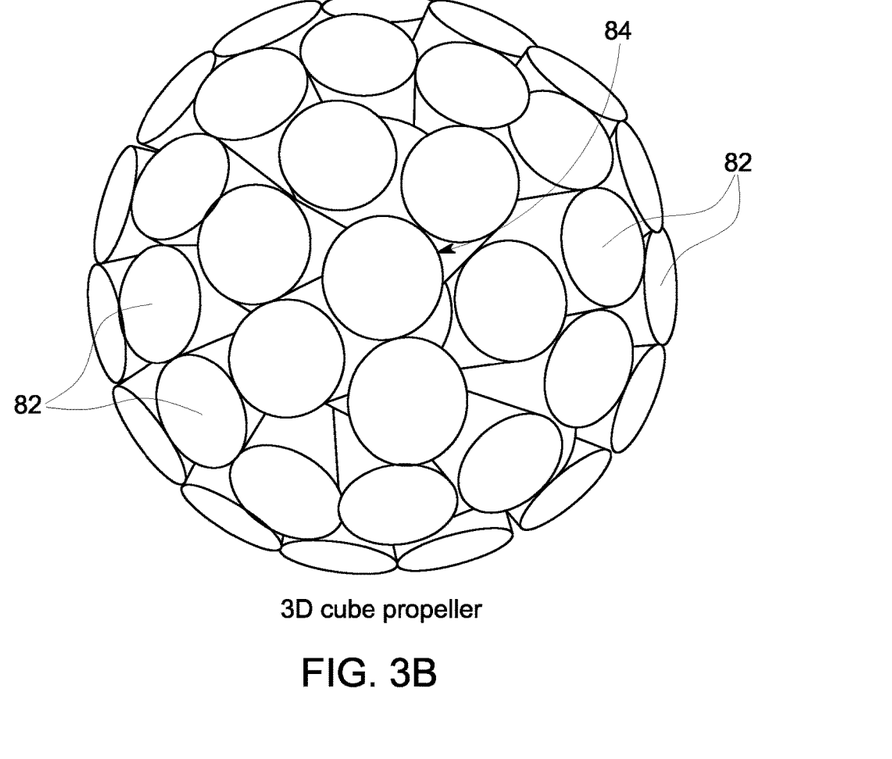
FIG. 3B is an illustration of a 3D PROPELLOR-like k-space data acquisition.

According to embodiments of the invention, various forms of PROPELLER can be employed with respect to STEP 74—including a 2D PROPELLER trajectory for 2D FSE and a 3D PROPELLER-like trajectory for 3D FSE (i.e., "3D Cube")—as are illustrated in FIGS. 3A and 3B, respectively, with blades 80 or cylinders 82 being rotated about the center of k-space 84. Additionally, PROPELLER may be employed where multiple RF coils in the MRI system 10 receive echoes that are used to create separate blades or strips in k-space, with each blade preferably extending through the center of k-space. The echo train is sampled such that a blade does not have all lines filled with acquired data, and a parallel imaging or partial Fourier technique is used to fill each blade partially acquired. The blades are incrementally rotated about the center of k-space with each echo train, are partially sampled, and are filled until a full set of blade data is acquired.

The use of a FSE-PROPELLER technique for MR data acquisition serves to minimize the generation of acoustic noise as compared to a FSE technique using a standard Cartesian acquisition, as limited phase encoding is employed with the FSE-PROPELLER technique. That is, each blade (2D) or cylinder (3D) that is acquired includes center k-space only along phase encoding direction(s), which requires only small phase encoding gradients, thus significantly reducing acoustic noise levels resulting from the FSE pulse sequence. The small phase encoding gradients also provide for reduced echo spacing. Of additional benefit is that the FSE-PROPELLER technique is also motion robust, as all or a portion of each blade may be reconstructed into a low-resolution image—with the image from each blade being compared to determine a relative amount of motion between the images and the k-space data of each blade being corrected for the motion so as to provide for the combination of blades to produce a fully acquired data set, which is reconstructed to produce a motion-corrected image.

With regard to the optimizing of gradient waveforms in an applied pulse sequence, at STEP 76, modifications are made to the gradient pulses in a FSE-PROPELLER pulse sequence in order to the level of acoustic noise generated by the pulse sequence—with such modifications being determined and controlled by system control 32, for example. The particular gradient waveform optimization that is performed is based on the gradient acoustic modeling performed at STEP 72, with the acoustic modeling providing idealized gradient pulses for a particular pulse sequence that is to be performed. According to one embodiment, in performing STEP 76, system control 32 accesses the gradient acoustic model to determine an optimized gradient waveform for the pulse sequence(s) that will minimize the acoustic noise level generated thereby, with the system control 32 then causing the gradient coils (in gradient coil assembly 50) to generate gradient pulses in each pulse sequence having the determined optimized gradient waveform.

Figure 4:
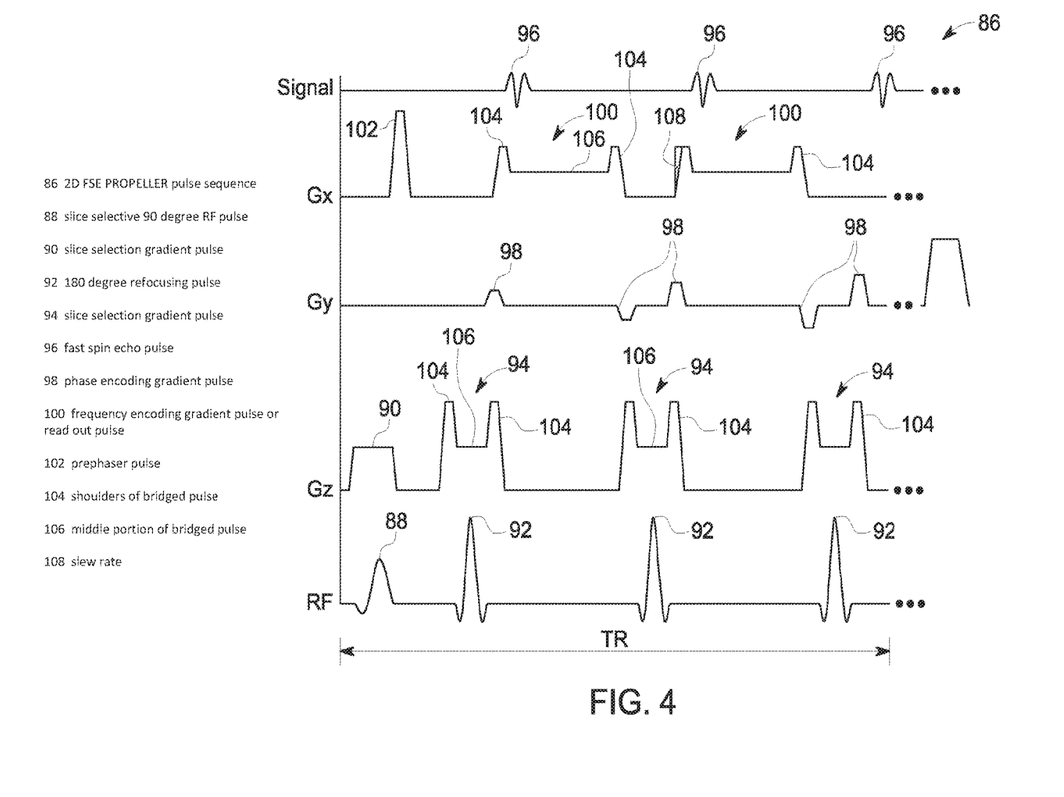
FIG. 4 is an illustration of a known 2D MR pulse sequence and data acquisition.
Figure 5:
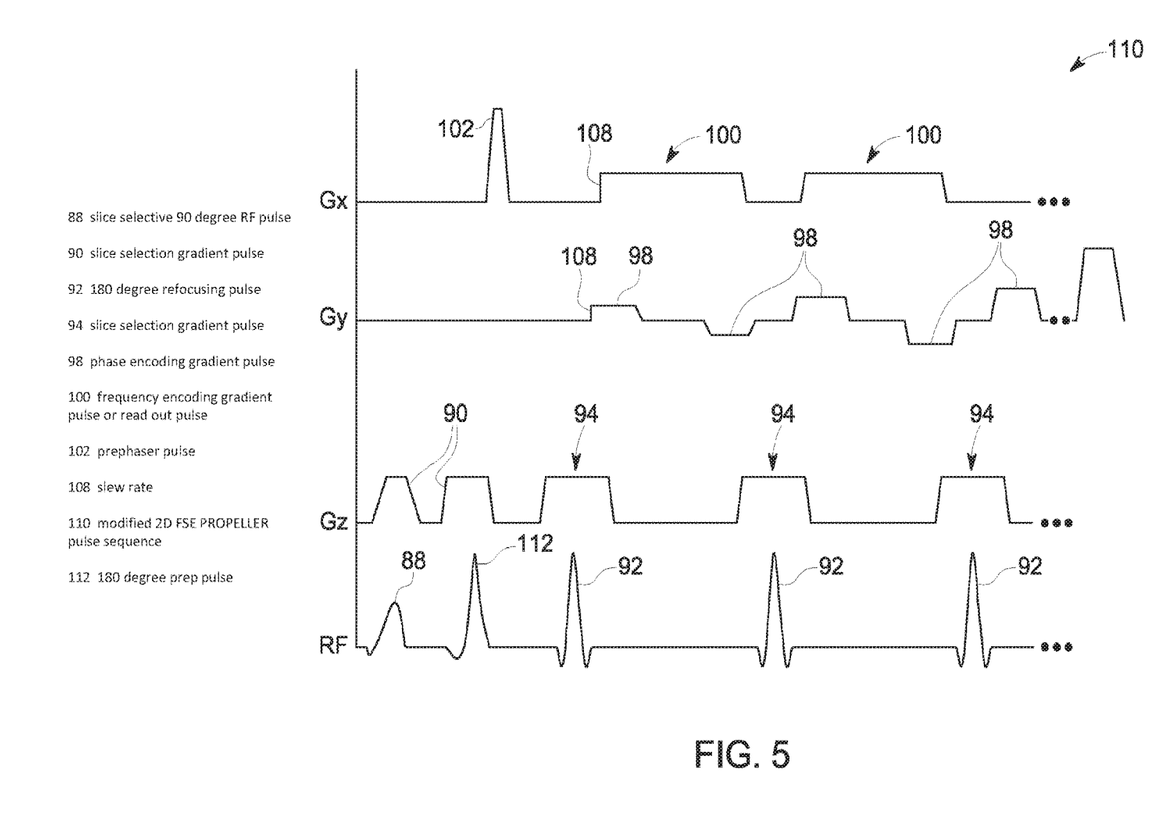
FIG. 5 is an illustration of a modified 2D MR pulse sequence and data acquisition according to an embodiment of the invention.

For purposes of better understanding the optimization of gradient waveforms that is performed at STEP 76, a typical pulse sequence employed for FSE-PROPELLER and a pulse sequence with modified gradient pulses for FSE-PROPELLER are illustrated in FIGS. 4 and 5. Referring first to FIG. 4, a standard pulse sequence 86 for 2D FSE-PROPELLER is shown. As is well-known, the pulse sequence 86 is initiated by a slice selective 90 degree RF pulse 88 that is applied in conjunction with a slice selection gradient 90. A 180 degree refocusing pulse 92, in conjunction with a slice selection gradient pulse 94, is repeatedly applied throughout the pulse sequence repetition time (TR). The number of refocusing pulses 92 coincides with the number of echoes 96 that will be sampled to fill k-space. Following application of each slice selection gradient pulse 94, a phase encoding gradient pulse 98 is applied. The phase encoding defines where in k-space MR data from a particular echo is placed. In this regard, the phase encoding gradient pulses 98 are incrementally changed in application during the TR interval. In the illustrated example, the strength of the phase encoding gradients 98 increases during the TR interval. One skilled in the art will readily appreciate that other phase encoding patterns may be employed and are considered within the scope of the invention, as in a 3D acquisition scheme that incorporates two phase encoding axes. A frequency encoding gradient or "readout" pulse 100 is applied after each phase encoding pulse 98 so that an echo may be sampled. As is understood in the art, a prephaser pulse 102 is applied after the 90 degree RF pulse but before the readout gradient 100 to center the spin echo 96 within the readout gradient.

As can be seen in FIG. 4, slice selection gradients 94 and frequency encoding (readout) gradients 100 are configured as bridged pulses that include shoulders 104 (or "horns") thereon. These shoulders 104 have an increased amplitude as compared to the middle portion 106 of the bridged pulse, and these shoulders 104 therefore generate an increased level of acoustic noise. As such, the presence of shoulders 104 on the bridged slice selection gradients 94 and frequency encoding gradients 100 is undesirable.

With further regard to the FSE pulse sequence in FIG. 4, in general it is common to ramp up and down the gradient with highest slew rate to reduce echo spacing. The gradient slew rate is the speed rate of ascent or descent of a gradient from zero to its maximum amplitude, either positive or negative (i.e., amplitude divided by the rise time in msec, measured in T/m/sec—generally indicated as 108). Thus, the greater the slew rate, the faster the gradients and therefore reduced echo spacing. However, an increased slew rate also results in an increased level of acoustic noise. As such, the increasing of the slew rate in FSE pulse sequences is undesirable with regard to acoustic noise levels.

Referring now to FIG. 5, a modified pulse sequence 110 for FSE-PROPELLER designed to minimize acoustic noise levels is shown according to an embodiment of the invention. RF pulses 88, 92, slice selection gradients 90, 94, phase encoding gradients 98, and frequency encoding (readout) gradients 100 are identified with like numbers to the corresponding pulses in the pulse sequence 86 of FIG. 4. In modifying the pulse sequence to minimize acoustic noise levels associated therewith, modifications can be made to the slice selection gradients 90, phase encoding gradients 98, and frequency encoding (readout) gradients 100.

As shown in FIG. 5, in order to reduce acoustic noise levels, the maximum amplitude of the bridged pulse slice selection gradients 94 and the frequency encoding (readout) gradients 100 is lowered in the modified pulse sequence. While the product gradient waveform design on the slice selection and frequency encoding gradients 94, 100 is maintained, the shoulders/horns 104 (FIG. 4) on the gradient pulses 94, 100 are removed/leveled so as to make an amplitude of these pulses flat. Based on the acoustic model (determined at STEP 72), removing the shoulders 104 for bridged pulses will reduce the acoustic noise level of the modified pulse sequence 110, with reductions in acoustic noise of 10 dBA, for example, being achievable.

As further shown in FIG. 5, the gradient pulses are further modified to reduce acoustic noise levels. For example, to minimize the acoustic level, the phase encoding gradient 98 is expanded time-wise to occupy the available time between the refocus pulse slice selection gradient 94 and the readout gradient 100. It is recognized that other gradient pulses may also be expanded within available times to minimize the acoustic level. Additionally, the slew rate 108 of the gradient pulses is lowered to reduce acoustic noise levels. According to one embodiment of the invention, a mixed gradient slew derating for different gradient pulses is employed so as to minimize echo space impact while maximizing acoustic noise level reduction. That is, a base gradient slew rate is used for most gradients (e.g., prescan gradient pulses, IR prep gradient pulses, and chemical saturation gradient pulses, for example), with the readout prephaser pulse (gxl) 102 and the readout crusher gradients (gxwl, gxwr) 100 using higher than base slew rates. According to one embodiment, the base slew rate for most gradients is derated to 3 T/S/M.

With regard to the application of an additional 180 degree prep pulse in an applied pulse sequence, at STEP 78, the additional pulse is provided in a FSE-PROPELLER pulse sequence in order to minimize echo spacing and thus minimize image quality impact. For purposes of better illustrating the additional 180 degree prep pulse that is applied at STEP 78, reference is made back to the typical FSE-PROPELLER pulse sequence 86 of FIG. 4 and the modified FSE-PROPELLER pulse sequence 110 of FIG. 5. As set forth previously, FIG. 4 illustrates a standard pulse sequence that is initiated by a slice selective 90 degree RF pulse 88 that is applied in conjunction with a slice selection gradient 90. A 180 degree refocusing pulse 92, in conjunction with a slice selection gradient pulse 94, is repeatedly applied throughout the TR, with the number of refocusing pulses 92 coinciding with the number of echoes 96 that will be sampled to fill k-space. As further shown, a prephaser pulse 102 (gxl) is applied after the 90 degree RF pulse 88 but before a readout gradient 100 to center the spin echo 96 within the readout gradient.

As shown in FIG. 5, in the modified pulse sequence 110, an additional 180 degree prep pulse 112 is added between the RF excitation pulse 88 and the first refocus pulse 92. Also in the modified pulse sequence 110, the prephaser pulse 102—rather than being applied between the 90 degree RF pulse 88 and the first 180 degree refocusing pulse 92—is applied between the first 180 degree refocusing pulse and the second 180 degree refocusing pulse (but before the readout gradient 100). The added prep pulse 112 functions to minimize echo spacing, so as to thereby minimize image quality impact that results from the gradient waveform design in the modified FSE-PROPELLER pulse sequence 110. That is, any reduction in image quality that might result from the reduced amplitude of the bridged pulse slice selection gradients 94 and frequency encoding gradients 100 and the increased echo time associated with the lowered gradient slew rate 108 of the gradient pulses can be mitigated by addition of the 180 degree prep pulse 112 to the modified FSE-PROPELLER pulse sequence 110. Additionally, the applying of the prephaser pulse 102 between the first and second 180 degree refocusing pulses 92 serves to reduce $B_0$ inhomogeneity artifacts (susceptibility artifacts in the brain for 3T).

Figure 6:
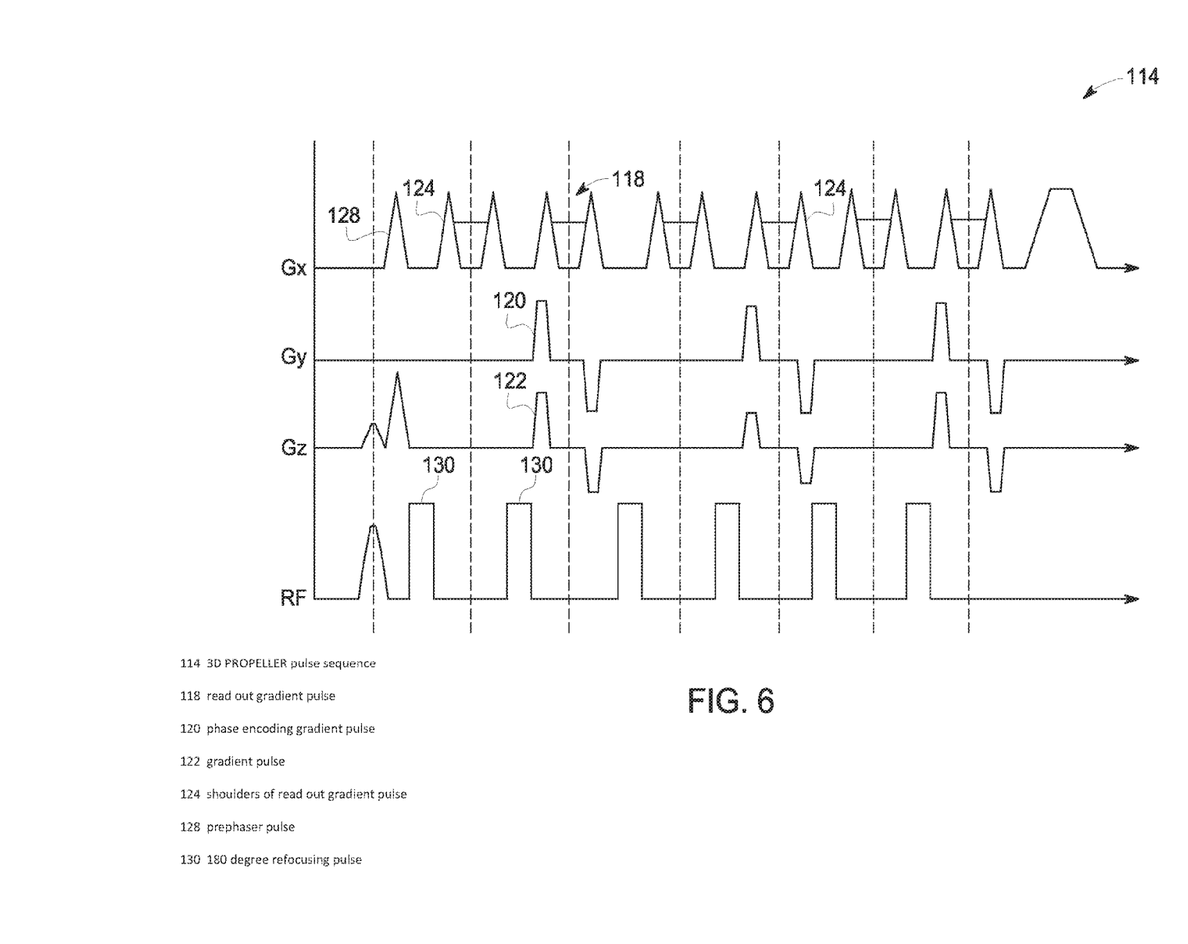
FIG. 6 is an illustration of a known 3D MR pulse sequence and data acquisition.
Figure 7:
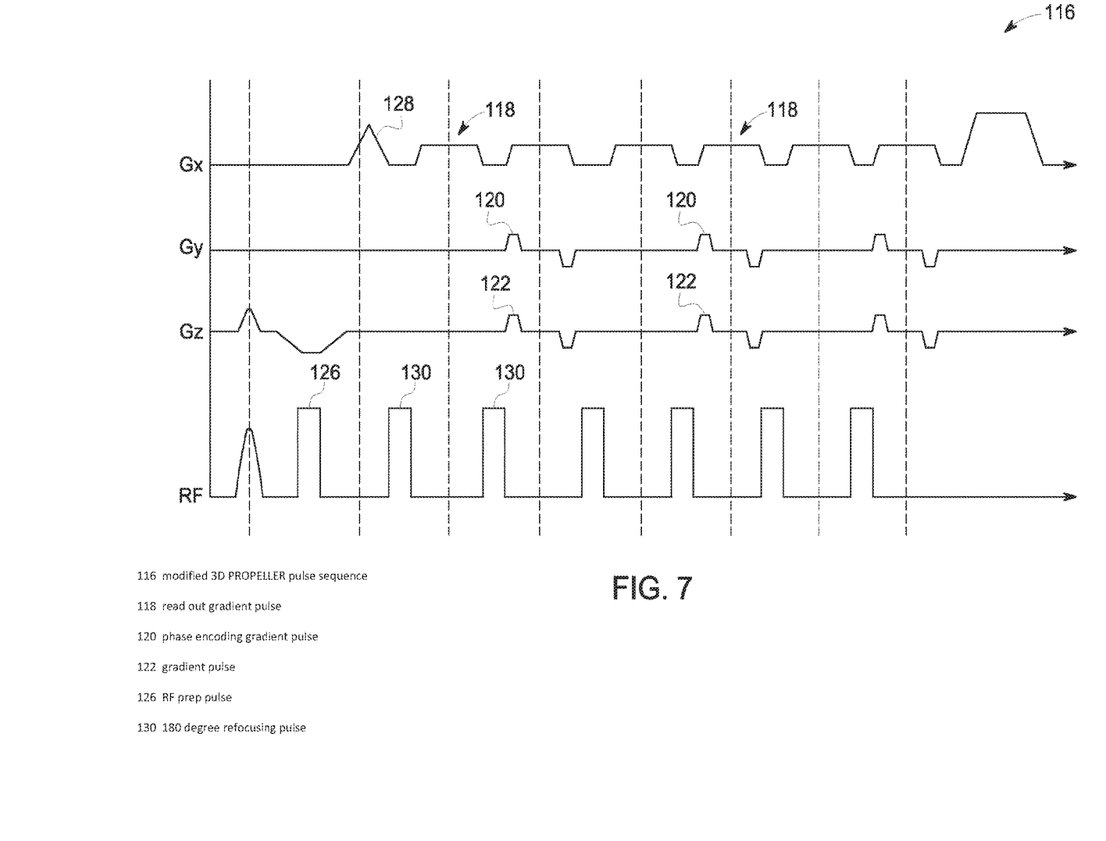
FIG. 7 is an illustration of a modified 3D MR pulse sequence and data acquisition according to an embodiment of the invention.

As indicated above, embodiments of the invention are not limited to 2D PROPELLER applications, but are also applicable to a 3D PROPELLER-like trajectory application. Referring now to FIGS. 6 and 7, a typical 3D PROPELLER pulse sequence 114 and a modified 3D-PROPELLER pulse sequence 116 are illustrated, respectively. As can be seen by a comparison of the pulse sequences, the gradients 118, 120, 122 are altered to minimize acoustic noise generated by the sequence. Specifically, shoulders 124 on readout gradients 118 are removed in the modified pulse sequence 116 to reduce a peak amplitude of the gradients 118. Additionally, the amplitude of the large crusher gradients 118, 122 is reduced and the amplitude of the large phase encoding gradients 120 is reduced in the modified pulse sequence 116. A mixed slew rate for gradients 118, 120, 122, with reduced a slew rate on some gradients (e.g., 3 T/m/s), is also introduced in modified pulse sequence 116, along with an additional RF prep pulse 126 that functions to improve image quality. Furthermore, a prephaser pulse 128 in modified pulse sequence 116 is applied between first and second 180 degree refocusing pulses 130—rather than being applied between a 90 degree RF excitation pulse 132 and the first 180 degree refocusing pulse 130 (as in pulse sequence 114. This applying of the prephaser pulse 128 between the first and second 180 degree refocusing pulses 130 serves to reduce $B_0$ inhomogeneity artifacts (susceptibility artifacts in the brain for 3T).

Beneficially, embodiments of the invention thus provide a system and method capable of acquiring T2 and FLAIR contrast at reduced acoustic noise levels. Reductions of 10 dBA or more can be recognized according to embodiments of the invention by employing of the technique 70—with decibel levels of 80 dBA for FSE-PROPELLER imaging being achievable. Embodiments of the invention achieve such acoustic noise level reduction while minimizing the impact on image quality and providing motion robustness. While embodiments of the invention are set forth above with regards to FSE sequences, it is recognized that the invention is also applicable to other MR pulse sequences—with acoustic modeling of gradient optimization and the use of PROPELLER being implantable with various pulse sequences to achieve reductions in acoustic noise levels.

A technical contribution for the disclosed method and apparatus is that is provides for a computer implemented method for reducing acoustic noise levels during MR image acquisition. A gradient slew rate derated PROPELLER technique is employed with gradient waveform optimization and an additional refocus RF pulse that results in reduced acoustic noise levels.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, according to one embodiment of the invention, a MRI apparatus includes a plurality of gradient coils positioned about a bore of a magnet, a radio frequency (RF) coil assembly coupled to a pulse generator to emit RF pulse sequences and arranged to receive resulting MR signals from a subject of interest, and a system control coupled to the plurality of gradient coils and the RF coil assembly to control operation thereof, the system control programmed to cause the plurality of gradient coils and the RF coil assembly to generate pulse sequences that each cause an echo train to form, with each of the pulse sequences including an RF excitation pulse, RF refocusing pulses, and gradient pulses, and being programmed to acquire blades of k-space data of the subject of interest from the pulse sequences, with each blade being filled by an echo train of a respective pulse sequence, and with the blades being rotated about a section of k-space compared to every other blade. The MRI apparatus also includes a computer programmed to reconstruct an image of the subject of interest from the acquired blades of k-space data. The system control the MRI apparatus is further programmed to cause the plurality of gradient coils to generate gradient pulses in each pulse sequence having an optimized gradient waveform that reduces an acoustic noise level generated thereby; and cause the RF coil assembly to generate a 180 degree prep pulse subsequent to generation of the RF excitation pulse and prior to generation of a first RF refocusing pulse, the 180 degree prep pulse configured to minimize echo spacing in the echo train.

According to another embodiment of the invention, a method of MR imaging includes generating an acoustic model that provides an estimate of an acoustic noise level for any given gradient waveform that is employed in an MR pulse sequence, determining an optimized gradient waveform for gradient pulses in an MR pulse sequence that minimizes an acoustic noise level generated thereby based on the generated acoustic model, and causing an RF coil assembly in an MR imaging system to apply RF pulses during a repetition time (TR) interval of each of a plurality of MR pulse sequences to generate an echo train for each of the plurality of MR pulse sequences, wherein the RF pulses in each MR pulse sequence comprise an RF excitation pulse, a plurality of RF refocusing pulses comprising a first RF refocusing pulse and a plurality of additional RF refocusing pulses, and a 180 degree prep pulse applied between the RF excitation pulse and the first RF refocusing pulse. The method also includes causing a plurality of gradient coils in the MR imaging system to apply gradient pulses during the TR interval of each of the plurality of MR pulse sequences, the gradient pulses having the optimized gradient waveform determined from the acoustic model. The method further includes acquiring blades of k-space data of the subject of interest from the plurality of MR pulse sequences, with each blade being filled by an echo train of a respective MR pulse sequence, and with the blades being rotated about a section of k-space compared to every other blade, and reconstructing an image of the subject of interest from the acquired blades of k-space data.

According to yet another embodiment of the invention, a computer readable storage medium is provided having stored thereon a computer program comprising instructions which, when executed by a computer, cause the computer to determine an optimized gradient waveform for gradient pulses in an MR pulse sequence that minimizes an acoustic noise level generated thereby, wherein the optimized gradient waveform is based on a previously generated acoustic model. The instructions further cause the computer to cause an RF coil assembly and a gradient coil assembly in an MR imaging system to apply radio frequency (RF) pulses and gradient pulses during a repetition time (TR) interval of each of a plurality of MR pulse sequences, wherein the gradient pulses are applied with the determined optimized gradient waveform and wherein the RF pulses in each MR pulse sequence comprise an RF excitation pulse, a plurality of RF refocusing pulses comprising a first RF refocusing pulse and a plurality of additional RF refocusing pulses, and a 180 degree prep pulse applied between the RF excitation pulse and the first RF refocusing pulse. The instructions further cause the computer to acquire blades of k-space data of the subject of interest from the plurality of MR pulse sequences using a Periodically Rotated Overlapping Parallel Lines with Enhanced Reconstruction (PROPELLER) acquisition technique, with each blade being filled by an echo train of a respective MR pulse sequence, and with the blades being rotated about a section of k-space compared to every other blade, and to reconstruct an image of the subject of interest from the acquired blades of k-space data.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. A magnetic resonance imaging (MRI) apparatus comprising:
   a plurality of gradient coils positioned about a bore of a magnet;
   a radio frequency (RF) coil assembly that is coupled to a pulse generator in order to emit RF pulse sequences and the RF coil assembly also being arranged to receive resulting MR signals from a subject of interest;
   a system control coupled to the plurality of gradient coils and the RF coil assembly in order to control one or more operation(s) thereof, the system control being programmed with non-transitory instructions that when implemented cause the system control to implement the following:
      cause the plurality of gradient coils and the RF coil assembly to generate pulse sequences that each cause an echo train to form, with each of the generated pulse sequences including an RF excitation pulse, RF refocusing pulses, and gradient pulses;
      acquire blades of k-space data of the subject of interest from the generated pulse sequences, with each acquired blade being filled by an echo train of a respectively generated pulse sequence, and with the blades that are being rotated about a section of k-space also being compared to every other blade of k-space data;
      cause the plurality of gradient coils that generate gradient pulses in each of the generated pulse sequences to have an optimized gradient waveform that reduces an acoustic noise level generated by the gradient pulses themselves; and cause the RF coil assembly to generate a 180 degree prep pulse subsequent to generation of the RF excitation pulse and prior to generation of a first RF refocusing pulse, with the 180 degree prep pulse being configured to minimize an echo spacing in the echo train;

a computer programmed with non-transitory instructions that when implemented cause the computer to implement the following:

reconstruct an MRI image of the subject of interest from the acquired blades of k-space data; and generate an acoustic model that provides an estimate of an acoustic noise level of any given gradient waveform that is employed in the generated pulse sequences;

wherein when generating the acoustic model, the computer programmed with non-transitory instructions, is programmed to implement the following:

apply a sine gradient waveform with slowly varying frequency;

measure an acoustic response from the applied sine gradient waveform as a function of frequency in order to provide a transmissibility function;

estimate a phase corresponding to a magnitude of a frequency of the measured acoustic response in order to provide a transmissibility transfer function; and estimate an acoustic noise level resulting from the sine gradient waveform based on the provided transmissibility transfer function;

wherein estimating the acoustic noise level comprises:

taking a derivative of the sine gradient waveform;

determining a frequency content of the sine gradient waveform derivative; and multiplying the determined frequency content by the transmissibility transfer function in order to calculate an equivalent average sound pressure level.

2. The MRI apparatus of claim 1, wherein the system control, in causing the plurality of gradient coils to generate gradient pulses having an optimized gradient waveform, is further programmed to:

access the generated acoustic model in order to determine an optimized gradient waveform that is utilized with the generated pulse sequences that will minimize the acoustic noise level in the generated pulse sequences; and cause the plurality of gradient coils to generate gradient pulses in each generated pulse sequence having the determined optimized gradient waveform.

3. The MRI apparatus of claim 1, wherein the gradient pulses in a respectively generated pulse sequence comprise slice selection gradients, phase encoding gradients, and frequency encoding gradients.

4. The MRI apparatus of claim 3, wherein the system control, in causing the plurality of gradient coils to generate gradient pulses having an optimized gradient waveform, also reduces a maximum amplitude of at least one of the slice selection gradients and at least one of the frequency encoding gradients, that are part of a generated pulse sequence.

5. The MRI apparatus of claim 3, wherein the system control, in reducing the maximum amplitude of at least one of the slice selection gradients and at least one of the frequency encoding gradients, is further programmed to remove high amplitude shoulders from bridged pulses that occur in forming at least one of the slice selection gradients and at least one of the frequency encoding gradients in a generated pulse sequence, so as to make an amplitude of the bridged pulses flat.

6. The MRI apparatus of claim 3, wherein the system control, in causing the plurality of gradient coils to generate gradient pulses having an optimized gradient waveform, also expands a time-wise length of the phase encoding gradients, that are part of a generated pulse sequence.

7. The MRI apparatus of claim 3, wherein the system control, in causing the plurality of gradient coils to generate gradient pulses having an optimized gradient waveform, also lowers a slew rate of the gradient pulses.

8. The MRI apparatus of claim 7, wherein the system control is further programmed to cause a mixed gradient slew rate for the slice selection gradients, phase encoding gradients, and frequency encoding gradients that are generated, in order to control echo spacing in the echo train.

9. The MRI apparatus of claim 1, wherein the generated pulse sequences comprise fast spin echo (FSE) sequences, with the RF excitation pulse comprising a 90 degree pulse and the RF refocusing pulses comprising 180 degree pulses.

10. The MRI apparatus of claim 9, wherein the system control, in causing the plurality of gradient coils to generate gradient pulses, is further programmed to:

cause the plurality of gradient coils to apply a pre-phaser gradient pulse between first and second 180 degree RF refocusing pulses, rather than between the 90 degree RF excitation pulse and the first 180 degree refocusing pulse, in order to reduce B0 inhomogeneity artifacts.

11. The MRI apparatus of claim 1, wherein the system control, in acquiring blades of k-space data that is rotated about a section of k-space and then compared to every other blade, is also programmed to implement one of a 2D Periodically Rotated Overlapping Parallel Lines with Enhanced Reconstruction (PROPELLER) technique and a 3D PROPELLER technique.

12. A method of magnetic resonance (MR) imaging comprising:

generating in an MR imaging computer processor an acoustic model that provides an estimate of an acoustic noise level of any given gradient waveform that is employed in an MR pulse sequence;

determining with said computer processor an optimized gradient waveform of gradient pulses in an MR pulse sequence that minimizes an acoustic noise level generated thereby based on the generated acoustic model;

causing an RF coil assembly in an MR imaging system to apply radio frequency (RF) pulses during a repetition time (TR) interval of each of a plurality of MR pulse sequences in order to generate an echo train for each of the plurality of MR pulse sequences, wherein the applied RF pulses in each MR pulse sequence comprise:

an RF excitation pulse;

a plurality of RF refocusing pulses comprising:

a first RF refocusing pulse;

a plurality of additional RF refocusing pulses; and a 180 degree prep pulse applied between the RF excitation pulse and the first RF refocusing pulse;

causing a plurality of gradient coils in the MR imaging system to apply gradient pulses during the TR interval of each of the plurality of MR pulse sequences, with the applied gradient pulses having the optimized gradient waveform determined from the acoustic model;

acquiring blades of k-space data of the subject of interest from the plurality of MR pulse sequences, with each blade being filled by an echo train of a respective MR pulse sequence, and with the blades being rotated about a section of k-space and then subsequently compared to every other blade; and reconstructing an MRI image of the subject of interest from the acquired blades of k-space data;

wherein generating an acoustic model in the MR imaging computer processor further comprises the MR imaging computer processor implementing the steps of:

applying a sine gradient waveform with slowly varying frequency;

measuring an acoustic response from the sine gradient waveform as a function of frequency in order to provide a transmissibility function;

estimating a phase corresponding to a magnitude of a frequency of the measured acoustic response in order to provide a transmissibility transfer function; and estimating an acoustic noise level resulting from a gradient waveform based on the provided transmissibility transfer function, wherein estimating the acoustic noise level further comprises implementing the steps of:

taking a derivative of the sine gradient waveform;

determining a frequency content of the sine gradient waveform derivative; and multiplying the determined frequency content by the transmissibility transfer function in order to calculate an equivalent average sound pressure level.

13. The MR Imaging method of claim 12, wherein the gradient pulses in each respective MR pulse sequence comprises:

slice selection gradients,
phase encoding gradients, and
frequency encoding gradients; and wherein causing the plurality of gradient coils to apply gradient pulses having an optimized gradient waveform comprises at least one of:

reducing a maximum amplitude of at least one of the slice selection gradients and at least one of the frequency encoding gradients;

expanding a time-wise length of the phase encoding gradients; and lowering a slew rate of at least a portion of the gradient pulses.

14. The MR Imaging method of claim 13, further comprising a mixed gradient slew rate for the slice selection gradients, phase encoding gradients, and frequency encoding gradients, thereby permitting control of the echo spacing in the generated echo train.

15. The MR Imaging method of claim 12,
wherein the plurality of MR pulse sequences comprise 2D or 3D fast spin echo (FSE) pulse sequences; and
wherein acquiring blades of k-space data rotated that is rotated about a section of k-space and then compared to every other blade, is also programmed to implement one of a 2D Periodically Rotated Overlapping Parallel Lines with Enhanced Reconstruction (PROPELLER) technique and a 3D PROPELLER technique.

16. A non-transitory computer readable storage medium having stored thereon a magnetic resonance computer program comprising instructions, which, when executed by a computer, cause the computer to:

determine an optimized gradient waveform for gradient pulses in an MR pulse sequence that minimizes an acoustic noise level generated thereby,
wherein the optimized gradient waveform is based on a previously generated acoustic model;

cause an RF coil assembly and a gradient coil assembly in an MR imaging system to apply radio frequency (RF) pulses and gradient pulses during a repetition time (TR) interval of each of a plurality of MR pulse sequences,
wherein the gradient pulses are applied with the determined optimized gradient waveform and
wherein the RF pulses in each MR pulse sequence comprise:
an RF excitation pulse;
a plurality of RF refocusing pulses comprising
a first RF refocusing pulse and
a plurality of additional RF refocusing pulses; and
a 180 degree prep pulse applied between the RF excitation pulse and the first RF refocusing pulse;

acquire blades of k-space data of the subject of interest from the plurality of MR pulse sequences using a Periodically Rotated Overlapping Parallel Lines with Enhanced Reconstruction (PROPELLER) acquisition technique, with each blade being filled by an echo train of a respective MR pulse sequence, and with the blades being rotated about a section of k-space and then compared to every other blade; and reconstruct an MR image of the subject of interest from the acquired blades of k-space data;
wherein the previously generated acoustic model provides an estimate of an acoustic noise level of any given gradient waveform that is employed in the plurality of MR pulse sequences and the previously generated acoustic model is obtained by the MR processor implementing the steps of:
applying a sine gradient waveform with slowly varying frequency;
measuring an acoustic response from the applied sine gradient waveform as a function of frequency in order to provide a transmissibility function;
estimating a phase corresponding to a magnitude of a frequency of the measured acoustic response in order to provide a transmissibility transfer function; and
estimating an acoustic noise level resulting from the sine gradient waveform based on the provided transmissibility transfer function;
wherein estimating the acoustic noise level comprises:
taking a derivative of the sine gradient waveform;
determining a frequency content of the sine gradient waveform derivative; and
multiplying the determined frequency content by the transmissibility transfer function in order to calculate an equivalent average sound pressure level.

17. The non-transitory computer readable storage medium of claim 16, wherein the gradient pulses in each respective MR pulse sequence comprises:
slice selection gradients,
phase encoding gradients, and
frequency encoding gradients; and wherein, in causing the gradient coil assembly to apply gradient pulses with the determined optimized gradient waveform, the instructions further cause the computer to:

reduce a maximum amplitude of at least one of the slice selection gradients and at least one of the frequency encoding gradients;

expand a time-wise length of the phase encoding gradients; or lower a slew rate of at least a portion of the gradient pulses.

18. The non-transitory computer readable storage medium of claim 17, wherein, in causing the gradient coil assembly to apply gradient pulses with the determined optimized gradient waveform, the instructions further cause the computer to apply gradient pulses having a mixed gradient slew rate in order to control echo spacing in the echo train.

* * * * *